United States Patent [19]
Shinde et al.

[11] Patent Number: 5,493,507
[45] Date of Patent: Feb. 20, 1996

[54] DIGITAL CIRCUIT DESIGN ASSIST SYSTEM FOR DESIGNING HARDWARE UNITS AND SOFTWARE UNITS IN A DESIRED DIGITAL CIRCUIT, AND METHOD THEREOF

[75] Inventors: Hirotake Shinde; Kazuhito Sugino; Koji Nakamichi; Nozomu Matsubara; Atsushi Hikono, all of Kahoku, Japan

[73] Assignee: PFU Limited, Ishikawa, Japan

[21] Appl. No.: 136,203

[22] Filed: Oct. 15, 1993

[30] Foreign Application Priority Data

Apr. 19, 1993 [JP] Japan .................................. 5-091599

[51] Int. Cl.⁶ .................................................. G06F 17/50
[52] U.S. Cl. ......................... 364/489; 364/488; 364/578
[58] Field of Search .................................. 364/488, 489, 364/490, 578

[56] References Cited

U.S. PATENT DOCUMENTS

| | | | |
|---|---|---|---|
| 4,964,056 | 10/1990 | Bekki et al. | 364/488 |
| 5,051,938 | 9/1991 | Hyduke | 364/578 |
| 5,111,413 | 5/1992 | Lazansky et al. | 364/578 |
| 5,146,583 | 9/1992 | Matsunaka et al. | 364/489 |
| 5,164,911 | 11/1992 | Juran et al. | 364/578 |
| 5,220,512 | 6/1993 | Watkins et al. | 364/489 |
| 5,278,769 | 1/1994 | Bair et al. | 364/490 |
| 5,282,146 | 1/1994 | Aihara et al. | 364/489 |
| 5,325,309 | 6/1994 | Halaviati et al. | 364/488 |
| 5,331,568 | 7/1994 | Pixley | 364/489 |
| 5,367,468 | 11/1994 | Fukasawa et al. | 364/490 |

OTHER PUBLICATIONS

DeGroat et al., Fall 1992 Conference sponsored by VHDL International, "Managing System Design and Development with VHDL", Oct. 18–21, 1992.

*Primary Examiner*—Vincent N. Trans
*Attorney, Agent, or Firm*—Nikaido, Marmelstein, Murray & Oram

[57] ABSTRACT

A digital circuit design assist system is directed to provide a system which independently verifies hardware divided into a plurality of units or the hardware and software, and reduces the design time. The system includes a functional model storage unit 1 for storing functional models in order to design hardware for a desired digital circuit including the hardware alone or the hardware and firmware, and functionally expressing the digital circuit by a hardware description language through a text editor 15 by coding input. Logic synthesis system 2 is provided for converting the functional model to a structural model, structurally expressed by the hardware description language. Structural model storage unit 3 is provided for storing the structural model, and a language model library storage unit 4 is provided for storing language models each expressing each of a plurality of components constituting the hardware by the hardware description language. Hardware description language simulation system 5 is provided for verifying correctness of the logic of the hardware from the functional model, the structural model and the language model.

19 Claims, 11 Drawing Sheets

Fig.10

ENTITY DECLARATION OF FULL ADDER

```
entity Full_Adder is
  port(A, B, CI: in mv1
       , S, CO  : out mv1);
end Full Adder;
```

TYPE 1 ARCHITECTURE

```
architecture TYPE1
     of Full_Adder is
begin
   P process
   begin
      wait on A, B, CI;
      S <= (A xor B)
         xor CI);
      CO <= (A and B)
         or ((A xor B)
            and CI);
   end P;
end TYPE1;
```

TYPE 2 ARCHITECTURE

```
architecture TYPE2
     of Full_Adder is
begin
  signal temp_s mv1;
  signal temp_c mv1;
  signal temp_d mv1;
  P0 process
  begin
     wait on A, B   ;
     temp_s<=A xor B;
     temp_c<=A and B;
  end P0;
  P1 process
    .........
  P2 process
    .........
    .........
  end TYPE2;
```

Fig.11

ENTITY DECLARTION OF FULL ADDER

```
entity Full_Adder is
  port(A. B. CI:in mv1
       . S. CO :out mv1);
end Full Adder;
```

TYPE 3 ARCHITECTURE

```
architecture TYPE3
    of Full_Adder is
begin
    component Half_Adder
         port(X. Y in:mv1
       , C, S out mv1) ;
    component OR_GATE
    . . . . . . . . .
    begin
       C0:Half_Adder
          port map (
          . . . . . . . . .
       C1:Half_Adder
          . . . . . . . . .
       C2:OR_GATE
    end;
end TYEP3;
```

COMPONENT DECLARATION → (points to component Half_Adder declaration)

COMPONENT INSTANCE → (points to C0:Half_Adder instance)

DIGITAL CIRCUIT DESIGN ASSIST SYSTEM FOR DESIGNING HARDWARE UNITS AND SOFTWARE UNITS IN A DESIRED DIGITAL CIRCUIT, AND METHOD THEREOF

BACKGROUND OF THE INVENTION

1. Field of the Invention

This invention generally relates to a digital circuit design assist system and a method thereof. More particularly, the present invention relates to a digital circuit design assist system and a method thereof for designing a desired large-scale digital circuit, using work stations, which can generate functional models consisting of hardware for a desired digital circuit by using a hardware description language such as VHDL, can convert a functional model to a structural model by logic synthesis means, can generate the structural model by direct coding means (text·editor) or image processing means (schematic capture), can independently verify the logic of the digital circuit as a whole as one digital circuit when only the functional models exist when the functional models and the structural models exist in a mixed state or when the structural models alone exist, and can further independently verify hardware and software as to whether or not a desired digital circuit can be obtained as a digital circuit comprising a unitary combination of the hardware and the software by loading the software object code of the digital circuit to memory inside the virtual hardware.

2. Description of the Related Art

Because digital circuits at the early stage of their development were limited in size, design and verification of these digital circuits as generally carried out by the steps of designing a logic circuit comprising the combination of components constituting a digital circuit such as resistors, capacitors, ICe, MSIs, LSIs, etc, designing a component arrangement diagram for laying out these components on a printed circuit board and a wiring diagram for wiring connecting the components, actually mounting the selected components on the printed circuit board on the basis of these designs, supplying a current to the resulting printed board, connecting a peripheral circuit or circuits to the printed board, whenever necessary, and verifying whether or not the functions of the printed board satisfied the intended requirements.

As the scale of the LSIs increased in recent years, design of a digital circuit comprising one integrated circuit or at least one integrated circuit and other components has become very complicated, and the design of the digital circuit and the verification of its logic, the design of the actual assembly of the components forming the digital circuit, the verification of software to be loaded to the memory in the digital circuit, and verification of the integrated circuit or the printed board after actual mounting, need an extremely long time.

Recently, design and verification of digital circuits has been carried out using EWSs (Engineering Work Stations). In other words, this system comprises generating functional models constituting a desired digital circuit by coding in a predetermined language, converting all these functional models to structural models by predetermined logic synthesis means, verifying the hardware by the use of a simulator which makes it possible to observe the output waveforms of these structural models on a CRT screen capable of displaying the structural models such as a logic analyzer, producing an actual device on the basis of the structural models only when they pass this verification, such as an LSI itself or a printed board having the LSI and other components mounted thereto, loading a software to a storage unit of the printed board to as to test the actual device, whenever necessary, and thus verifying both the hardware and the software of the desired digital circuit (logic).

As described above, recent design and verification methods for digital circuits cannot verify the digital circuits having software loaded into the hardware thereof unless the actual device is fabricated. If any problem exists, a designer of the hardware and a designer of the software separately examine the hardware design and the software design to determine where the problem exists. If the problem exists in the hardware, the LSI or the printed board is repaired or a new product is produced, and if the problem exists in the software, the program is corrected and the corrected program is again loaded into the hardware so that the hardware and the software of the digital circuit can again be verified in the actual device after the failure of the design is corrected. If another problem remains to be solved, the procedures described above are repeated and verification of the actual device is again effected. However, this system requires excessive time and labor for tentatively producing the hardware. Furthermore, design of the digital circuit and design of the hardware for verification require large numbers of drawings, and a very long time is needed before the design of production hardware is completed.

SUMMARY OF THE INVENTION

In view of the problems with the prior art described above, the present invention aims at providing a digital circuit design assist system which divides the hardware constituting the digital circuit described above into a plurality of divided hardware parts, can design the digital circuit while individually verifying the divided hardware parts, and can design the digital circuit comprising the integrated hardware and software while independently verifying the hardware and the software, in order to reduce the time necessary for verification of a particularly large-scale high-quality digital circuit, the time necessary for actual mounting design, and the time necessary for verification of the software to be loaded to the memory of the digital circuit.

FIG. 1 of the accompanying drawings is an over-all structural diagram of the digital circuit design assist system according to the present invention. In a digital circuit design assist system for designing hardware in a desired digital circuit comprising hardware alone or hardware and firmware for controlling the hardware, the digital circuit design assist system for accomplishing the objects described above according to the present invention comprises:

(1) a functional model storage unit I for storing functional models each functionally expressing a digital circuit in a hardware description language inputted through a text editor 15;

(2) logic synthesis means 2 for converting the functional models to structural models structurally expressed by the hardware description language;

(3) a structural model storage unit 3 for storing the structural models;

(4) a language model library storage unit 4 for storing a language model expressing each of a plurality of components constituting the hardware by the hardware description language; and (5) a hardware description language simulation means 5 for verifying whether or not the logic of the hardware is correct, with regard to the functional models, the structural models, and the language models.

In a digital circuit design assist system for designing hardware in a desired digital circuit comprising hardware and firmware for controlling the hardware, the digital circuit design assist system according to the present invention further comprises a software program code interface 11 for loading software, comprising at least some of the firmware described above, an application program, for executing predetermined processing, loaded into a storage unit of the digital circuit, and a diagnosis program for verifying the logic of the entire digital circuit, or a part of the digital circuit, into the hardware description language simulation means 5 described above.

In the digital circuit design assist system according to the present invention, the hardware description language simulation means 5 described above independently verifies the hardware and the software of the digital circuit from the functional models, the structural models, the language models, and the software.

The digital circuit design assist system according to the present invention further comprises an automatic placing and routing tool 12, into which the structural models are inputted, which automatically produces a layout for accomplishing the structural models on a printed board or on an integrated circuit on the basis of the dimensions of the components expressed by the structural models and on the basis of the amount of wiring.

The digital circuit design assist system according to the present invention further comprises a fault analysis tool 13 to which the structural models are inputted, and which diagnoses any failure of the structural models.

The fault analysis tool 13 in the digital design assist system according to the present invention includes an automatic test pattern generation tool for automatically generating a test pattern for analysing any fault of the structural models.

The digital circuit design assist system according to the present invention further comprises a physical characteristics analysis tool 14 to which the structural models described above are inputted, and which verifies whether or not the layout is appropriate in which the layout accomplishing the structural models on the printed board or the integrated circuit on the basis of physical characteristics such as wiring lines, delay times, exothermy, etc, of the structural models and/or radio waves, and which evaluates reliability of an actual device of the digital circuit when actually and physically mounted.

The digital circuit design assist system according to the present invention further comprises a code generation means for generating the structural models through a text editor 15 by coding input or a graphic generation means for generating the structural models through a block editor (schematic capture) 16 for expressing each of a plurality of components constituting the hardware by an inherent symbol, drawing and arranging these symbols on a screen,-drawing wirings between these components arranged on the screen, and processing for them or both of the generation means.

The digital circuit design assist system according to the present invention further comprises means for dividing one digital circuit into a plurality of circuit units, and independently generating the structural models constituting the divided digital circuit units, wherein the hardware description language simulation means 5 verifies the logic of the digital circuit, comprising only the functional models, or the functional models and the structural models, or only the structural models, as one digital circuit.

The hardware description language in the present invention is VHDL, wherein V stands for very high speed integrated circuits, H for hardware, D for description and L for language.

In the digital circuit design assist system described above for designing hardware for a desired digital circuit consisting solely of the hardware or the hardware and a firmware for con,rolling the hardware, a digital circuit design assist method according to the present invention comprises a first step of dividing one digital circuit into a plurality of circuit units; a second step of generating a functional model from each of the divided circuit units; a third step of verifying the logic of the hardware as one complete digital circuit by hardware description language simulation means 5 from a functional model and from a language model individually expressing a plurality of components constituting the hardware by a hardware description language, at a functional level stage where the functional model alone functionally express the digital circuit in the hardware description language; a fourth step of generating the structural model having the same logic as that of a functional model by using any one of the logic synthesis means 2 for converting the functional model to the structural model structurally expressed by the hardware description language, coding generation means for generating the structural model through a text editor 15 by coding input and graphic generation means for generating the structural model through a block editor (schematic capture) 16 for expressing each of the components by an inherent symbol, drawing and arranging the symbols on a screen, drawing wires between the components arranged on the screen and processing for them; a fifth step of verifying the logic of the hardware from the functional model, the structural model and a language model, independently of the execution of the fourth step in each of the divided digital circuit units by the hardware description language simulation means 5 as one complete digital circuit, at the stage of a mixed level at which the digital circuit is expressed in a mixed functional model and language model state; and a sixth step of verifying the logic of the hardware, as one complete digital circuit by the hardware description language simulation means 5 from the structural model and the language model, at the stage of the structural level at which the digital circuit is expressed by only the structural model.

In the digital circuit design assist system for designing hardware in a desired digital circuit consisting solely of hardware or hardware and firmware for controlling the hardware, a digital circuit design assist method according to the present invention comprises a first step of down-loading software comprising at least one of the firmware, an application program loaded in a storage unit of the digital circuit for executing a predetermined processing, and a diagnosis program for verifying the logic of part or the entirety of the digital circuit, to the hardware description language simulation means 5 through a software program code interface 11; a second step of verifying the logic of the hardware as one complete digital circuit by the hardware description language simulation means 5 from the functional model, a language model expressing individually the plurality of components constituting the hardware by the hardware description language, and the down-loaded software, and verifying the logic of the software independently of the verification of the logic of the hardware, at the stage of the functional level at which the digital circuit is expressed by only the functional model functionally expressing the digital circuit by the hardware description language; a third step of generating the structural model by the use of at least one logic synthesis means 2 for converting the functional model to the structural model structurally expressed by the hardware description language, coding generation means for generating the structural model through a text editor 15 by coding input and graphic generation means for generating the structural model through a block editor 16 for expressing each of the components by an inherent symbol, drawing and arranging the symbols on a screen, drawing wiring between the components and processing for them; a fourth step of verifying the logic of the hardware as one complete digital circuit by the hardware description language simulation means 5 from the functional model, the structural model, the language model and the software, and verifying the logic of the software independently of verification of the logic of the hardware, at a mixed level stage where the digital circuit is expressed by the functional model and the structural model in a mixed stage; and a fifth step of verifying the logic of the hardware as one complete digital circuit by the hardware description language simulation means 5 from the structural model, the language model and the software, and verifying the logic of the software independently of the verification of the logic of the hardware, at the structural level stage where the digital circuit is expressed by only the structural model.

In the digital circuit design assist system for designing hardware in a desired digital circuit consisting of hardware and firmware for controlling the hardware, a digital circuit design assist method according to the present invention comprises a first step of generating a functional model functionally expressing the digital circuit by a hardware description language; a second step of verifying the logic of the functional model by the hardware description simulation means 5 and simultaneously executing substitution of the functional model in a structural model without waiting for the verification of the logic; after generation of the functional model is completed; and a third step of independently executing automatic generation of layout for accomplishing the structural model on a printed board or on an integrated circuit when the digital circuit for which verification of the logic is under way or is completed, and all of the functional models have already been converted to the structural models, by an automatic placing and routing tool 12 on the basis of the dimensions of components expressed by the structural model and the amount of wiring, and verification of the logic of the digital circuit.

In the digital circuit design assist method described above, the third step independently executes automatic generation of a test pattern for fault analysis of the structural model, analysis of any fault of the structural model and verification of the logic of the digital circuit by an automatic test pattern tool and a fault analysis tool 13, when the digital circuit for which verification of the logic is under way or is completed, and all of the functional models have already been converted to the structural models.

In the digital circuit design assist method described above, verification whether or not the layout is appropriate in which the layout accomplishing the structural model on a printed board or on an integrated circuit, verification of reliability evaluation of an actual device of the digital circuit when mounted physically and actually, and verification of the logic of the digital circuit, are independently executed by a physical characteristics analysis tool 14 on the basis of physical characteristics such as wiring lines, delay times, exothermy, etc., in the structural model and/or radio waves when the digital circuit for which verification of the logic is under way or is completed, and all of the functional-models have already been converted to the structural models.

The present invention can execute verification of the logic of the hardware as one digital circuit at the mixed level where the functional models and the structural models exist in mixture before the actual device is produced, by dividing the hardware constituting the digital circuit into a plurality of circuit units, generating the functional model forming each of the divided hardware units, and generating the structual model corresponding to each functional model by conversion by the logic synthesis means, or by direct coding or by image processing. Accordingly, the design time can be reduced.

Since the software is loaded to the memory in the virtual hardware of the digital circuit, actually software, then the hardware and the software are independently verified as the digital circuit comprising the integral combination of the hardware and the software, before the actual device is produced, the time required for the verification can be shortened and reliability of the prototype device can be improved.

Further, before the actual device is produced, verification of the functional models after the production of all the functional models and the production of the structural models are simultaneously carried out, and the structural models thus produced are inputted to the automatic placing and routing tool, the fault analysis tool or the physical characteristics analysis tool thereby execute the actual mounting design at an early stage. Accordingly, when any problem of actual mounting occurs in these tools, verification of the functional models described above is suspended, and re-design can be started. Accordingly any waste of design effort can be prevented in advance.

Furthermore, since the hardware of the digital circuit can be generated by the use of the hardware description language, the design can be made without considering the delay time and sizes of the components constituting the hardware, but may be carried out by taking only the logic of the hardware into consideration. Accordingly, design becomes easier.

These and other objects and novel features of the present invention will become more apparent from the following description when taken in conjunction with the accompanying drawings.

BRIEF DESCRIPTION OF THE DRAWINGS

FIG. 10 is an explanatory view showing a program expressing the functional model shown in FIG. 9 by VHDL; and FIG. 11 is an explanatory view showing the structural model shown in FIG. 9 by VHDL.

DESCRIPTION OF THE PREFERRED EMBODIMENTS

Figure 2:
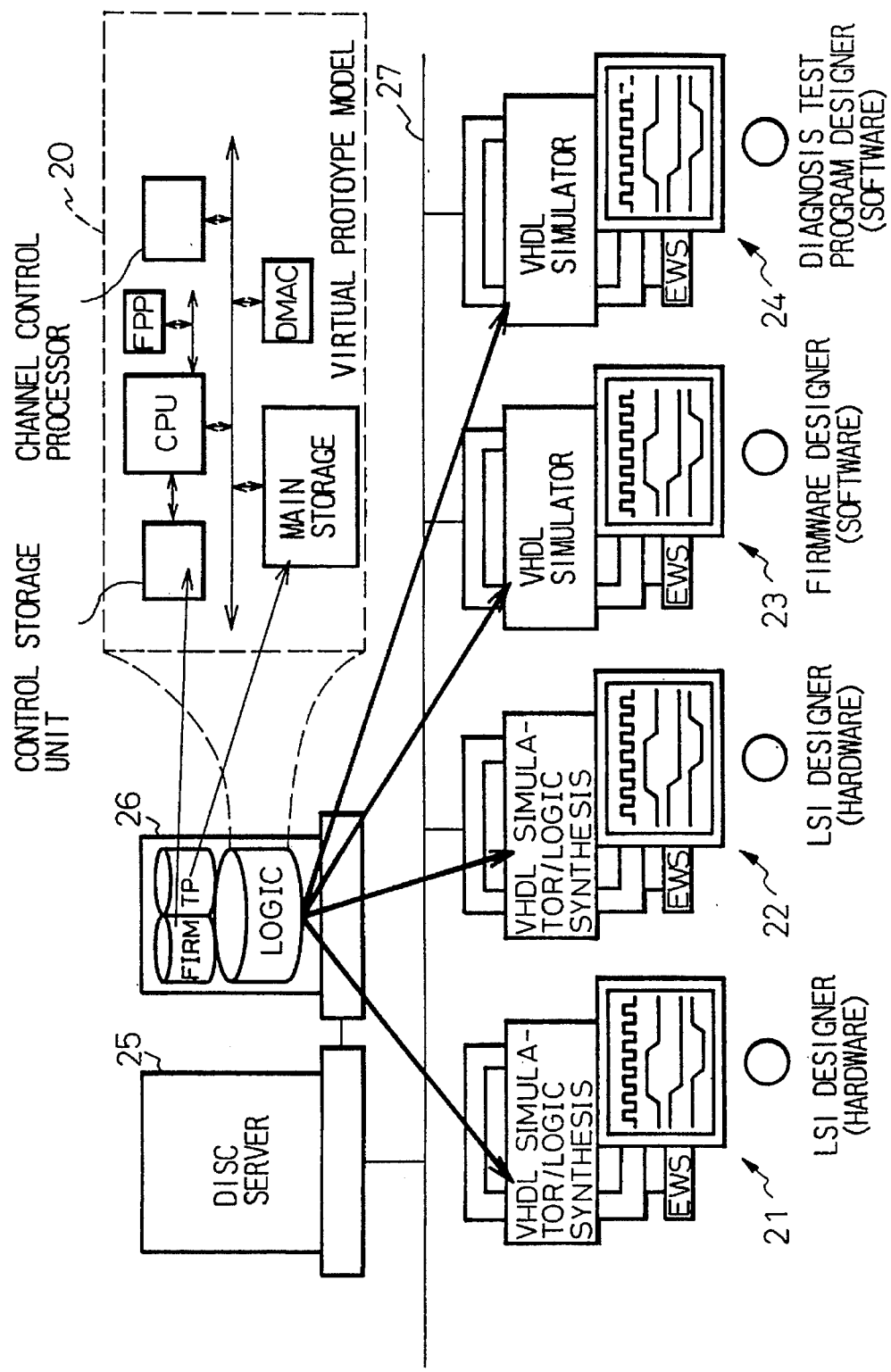
FIG. 2 is a block diagram showing an application example of the digital circuit design assist system according to the present invention.

FIG. 2 is a block diagram showing an application example of the digital circuit design assist system according to the present invention. Reference numerals 21 to 24 denote engineering work stations (EWSs), respectively. In the drawing, two of the four designers are LSI designers who are in charge of hardware design. The other two are in charge of software. One of the software designers designs firmware for controlling the digital circuit which is designed by the hardware designers, and the other designs a diagnostic test program for diagnosing whether or not the digital circuit designed by the hardware designers is normal. Reference numeral 20 denotes a virtual prototype model of a desired digital circuit. The hardware of the virtual prototype model of the digital circuit is stored in a LOGIC unit of a storage unit 26, and the firmware is stored in a FIRM unit of the storage unit 26. The diagnostic test program described above is stored in a TP unit of the storage unit 26. A disc server 25 is used for loading software, which is necessary for operating the digital circuit design assist system according to the present invention, into the storage unit in the system. The LSI designer at the EWS 21 or the EWS 22 analyses the logic of the virtual prototype displayed on a CRT of the EWS using a logic analyser. On the other hand, the software designer at the EWS 23 or the EWS 24 can watch the display to analyse the logic of the virtual prototype model on the CRT of the EWS or the description display by a software program on the CRT, and can also change the program by operating a keyboard, not shown in the drawing. Reference numeral 27 represents a bus line, which connects the EWSs 21 to 24 to the disc server 25 and to the storage unit 26 in such a manner that communication can be made between them.

Figure 3:
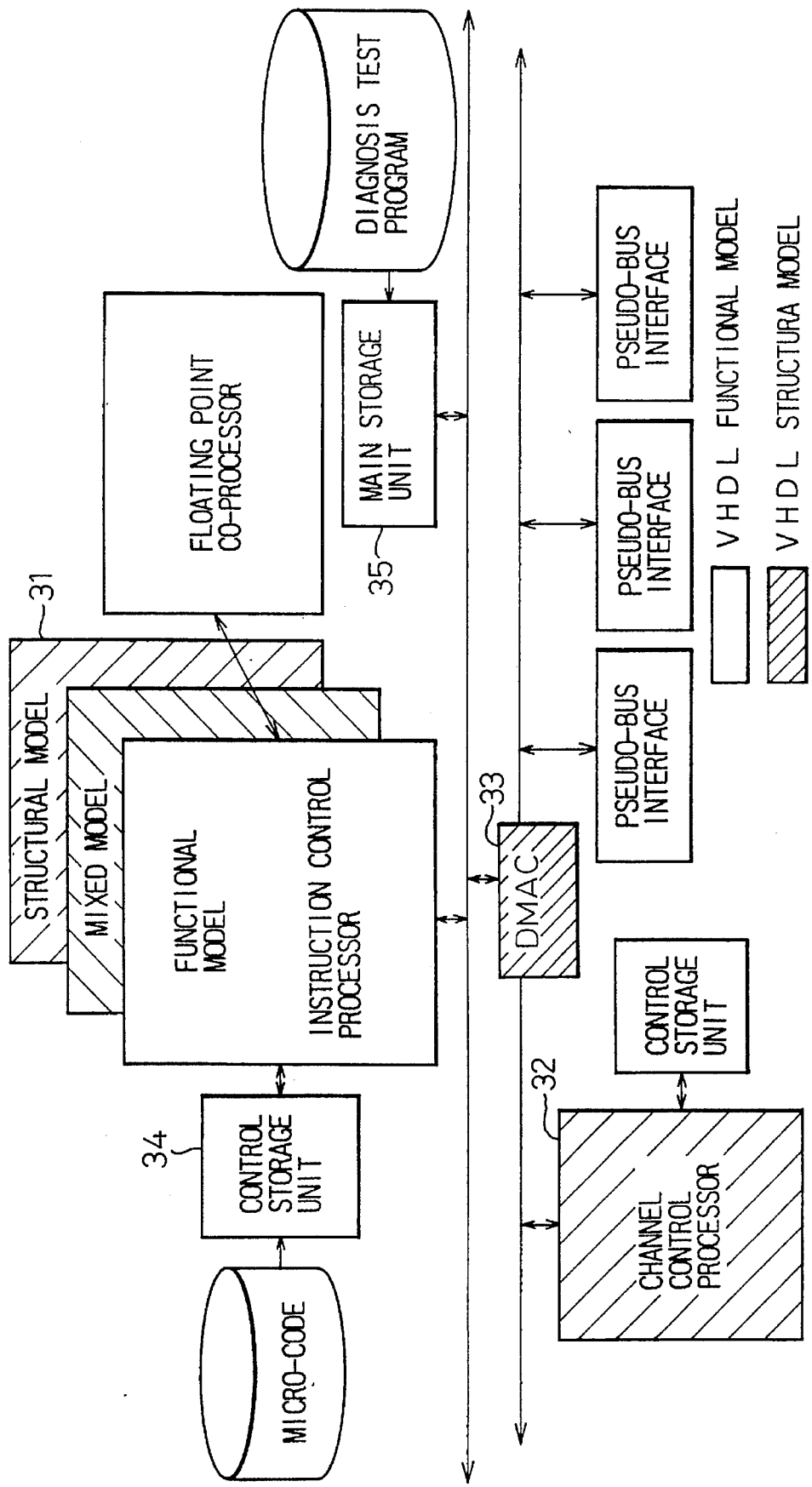
FIG. 3 is a block diagram showing a definite example of a circuit modelled by a hardware description language according to the present invention.

FIG. 3 is a block diagram showing a definite example of a circuit diagram modelled by the hardware description language of the present invention. In the diagram, reference numeral 31, 32 and 33 denote the devices consisting of structural models of VHDL. In this diagram, the firmware is stored generally in a control storage unit 34 while the test program is generally stored in a main storage unit 35.

Figure 4:
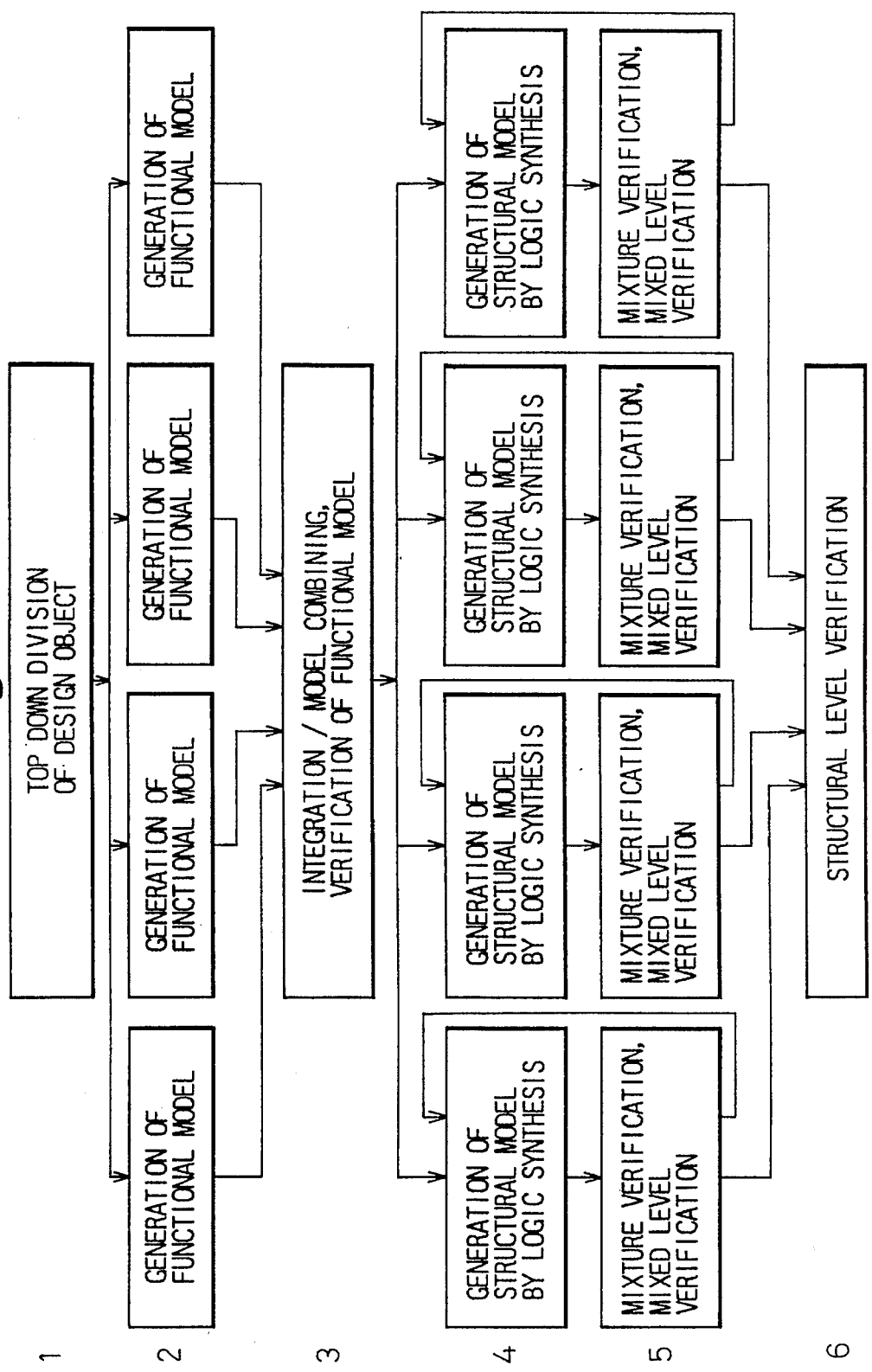
FIG. 4 is an explanatory view of a first embodiment of digital circuit design assist method according to the present invention.

FIG. 4 is an explanatory view of the first embodiment of a digital design assist method according to the present invention. This block diagram represents a simultaneous hardware design process by a plurality of designers according to the present invention, particularly, logic synthesis work. Reference numerals in the extreme left column represent step numbers, respectively. Work division of the hardware as a desired design object is made at Step 1, and a designer of each of the four work division sections works out a functional model of the hardware divided into four sections. After all the functional models are prepared, they are combined with one another and verified at Step 3, and the designer of each work division section logically synthesizes a structural model corresponding to each functional model at Step 4. In other words, each designer works out the structural model by conversion from the functional model, by the use of a text editor 15 by the coding input using coding generation means, or by the use of a block editor (schematic capture) 16 for expressing each of a plurality of components constituting the hardware by an inherent symbol, drawing and arranging these symbols on a screen and drawing and image-processing wiring between the components arranged on the screen. In order to confirm whether or not the structural model thus converted or substituted has the same logic as the corresponding functional model, equivalence is confirmed under a mixed state where only the substituted portions are the structural model and the other portions are the functional model, at Step 5. After all the structural models are converted or substituted, the structural level (gate level) is verified at Step 6.

Figure 5:
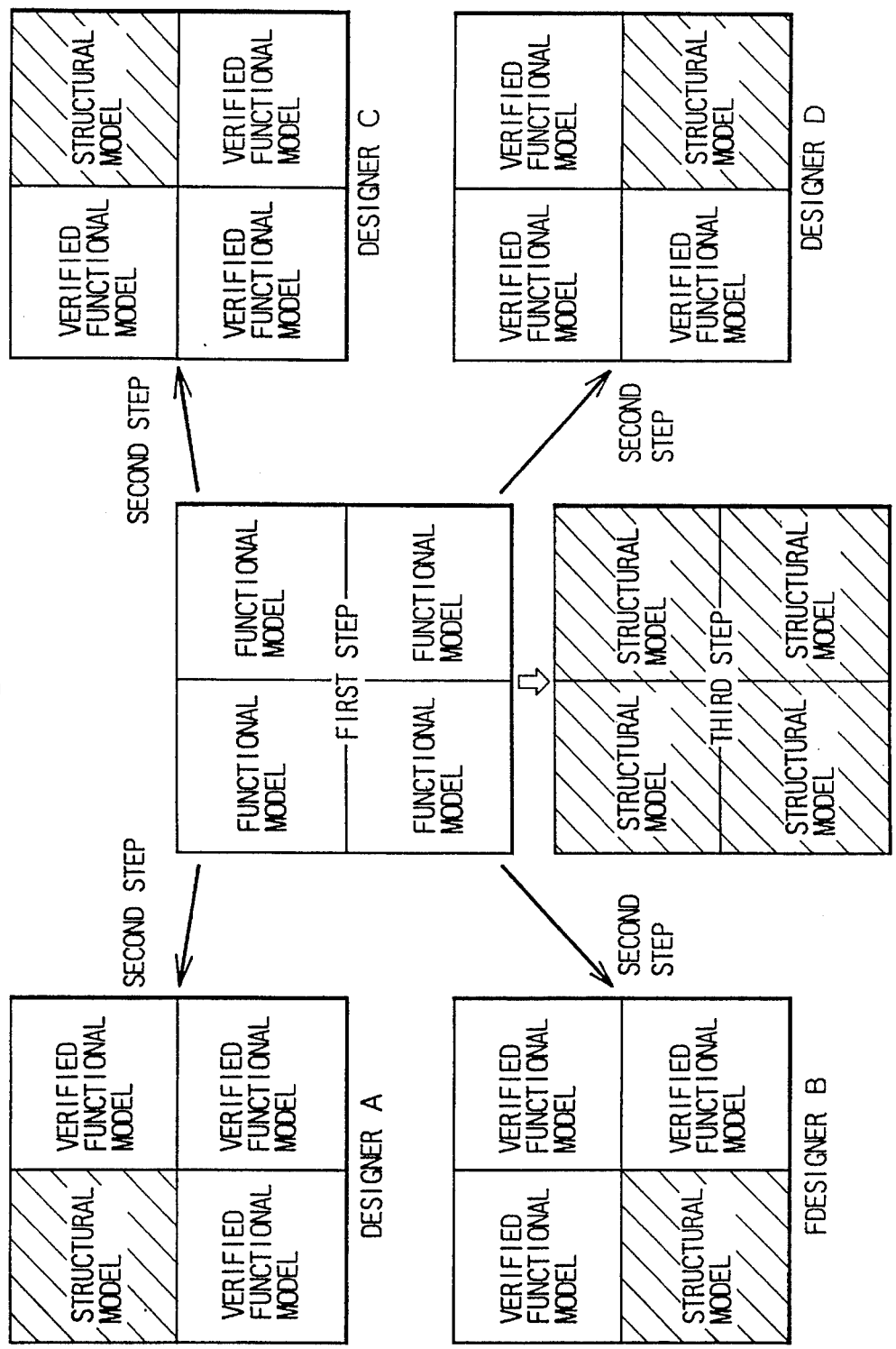
FIG. 5 is another explanatory view of the first embodiment of a digital circuit design assist method according to the present invention.

FIG. 5 is another explanatory view of the first embodiment of a digital circuit design assist method according to the present invention. In the diagram, the hardware of one digital circuit is divided into four units at the first step, and the functional model of each divided portion is generated by VHDL. The second step represents the process in which the structural model corresponding to each functional model of the hardware divided into four parts is independently generated. Hatched portions in the drawing represent the portions where four designers A, B, C and D are in charge of the operation of independently substituting the functional model by an optimum structural model. After each substitution is completed, the functional model is used for the other portions, and the operation of confirming the equivalence of the logic of the substituted portions is started before substitution of the other portions is completed. When the structural models of all the divided portions are generated at the third step, timing verification in the structural models and verification of the logic are started.

Figure 6:
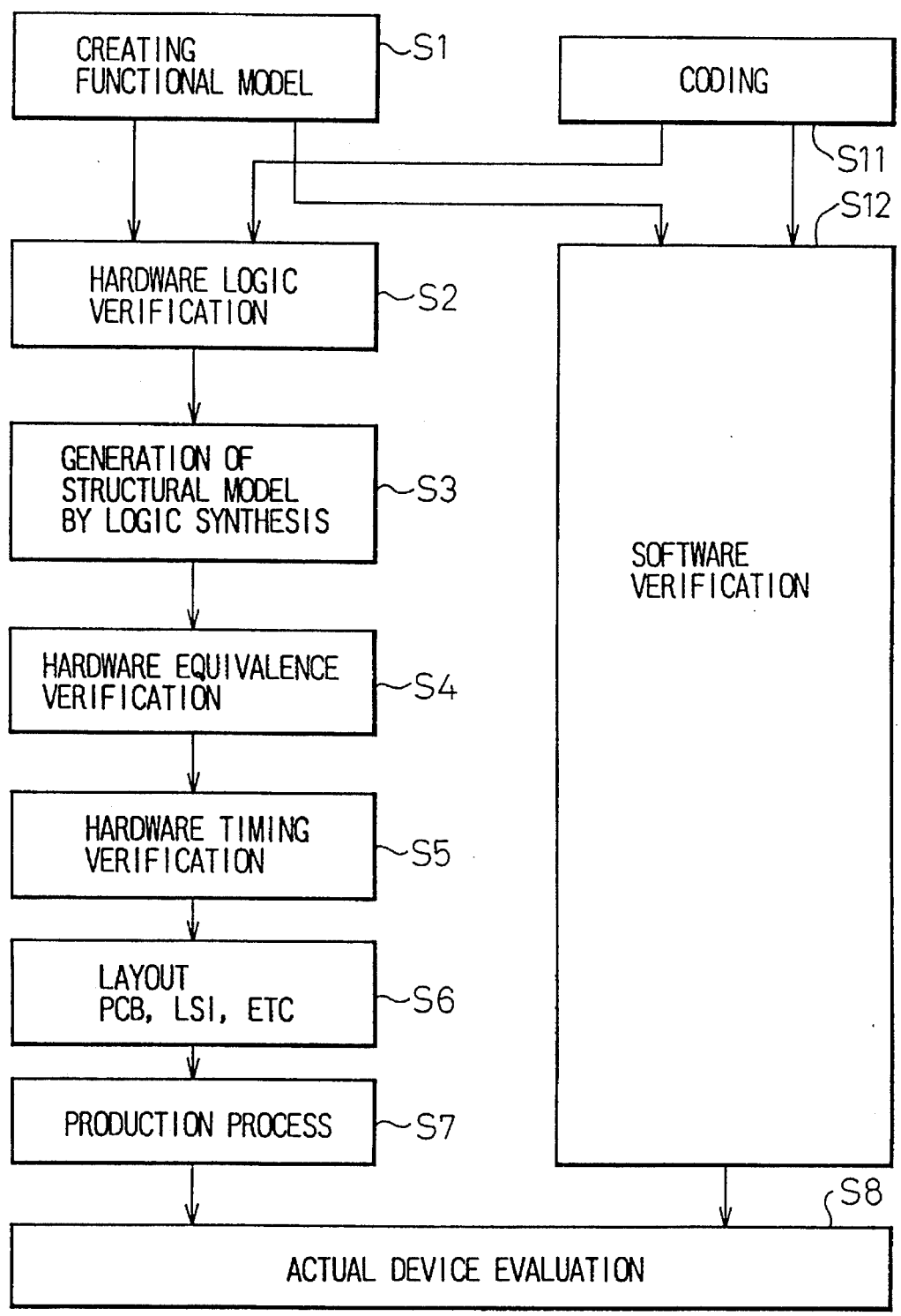
FIG. 6 is an explanatory view of a second embodiment of a digital circuit design assist method according to the present invention.

FIG. 6 is an explanatory view of the second embodiment of a digital circuit design assist method according to the present invention. An actual device evaluation method according to the present invention is characterized in that the-software and the hardware can be simultaneously verified and that whereas actual device evaluation is first made after the generation of the structural model according to the prior art, the present invention can start simultaneous verification of the software and the hardware after the creation of the functional model. The hardware design steps are shown on the left side of the diagram. First, the functional model is generated on the basis of the design specification (Step S1), and the hardware is logically verified on the basis of the functional model (Step S2). The functional model is logically synthesized and converted to the structural model, or the structural model is generated through the text editor 15 by having code input by a coding generation means. Alternatively, the structural model is generated through the block editor (schematic capture) 16 for expressing each of a plurality of components constituting the hardware by an inherent symbol, drawing and disposing these symbols on a screen and drawing and image-processing wiring between the components on the screen (Step S3). Next, the equivalence of the hardware is verified (Step S4) and the timing of logic of the hardware is verified on a CRT (Step S5). The layout to be accomplished on a printed board or on an LSI is automatically effected, on the basis of the dimensions of the components and the amount of wiring on the printed board or inside the LSI, using an automatic placing and routing tool 12, any failure of the structural model is analysed by a fault analysis tool 13 having an automatic test pattern generation tool for automatically generating a test pattern for diagnosing the failure of the structural model, and whether or not the layout accomplishing the structural model on the printed board or in the integrated circuit is appropriate and whether or not evaluation of the digital circuit when mounted actually and physically is proper, are verified by a physical characteristics analysis tool 14 on the basis of physical characteristics such as wiring lines, a delay time, exothermy of the structural model, etc, and/or radio waves (Step S6). Next, the actual device is fabricated (Step S7) and is evaluated (Step S8). On the other hand, the software design steps are shown on the right side of FIG. 6. First, coding is executed on the basis of the design specification (Step S11), the hardware and the software are independently verified (Step S12) and the actual device is evaluated (Step S8). By the way, the steps other than the Steps 7 and 8 are all the steps processed by the software.

Figure 7:
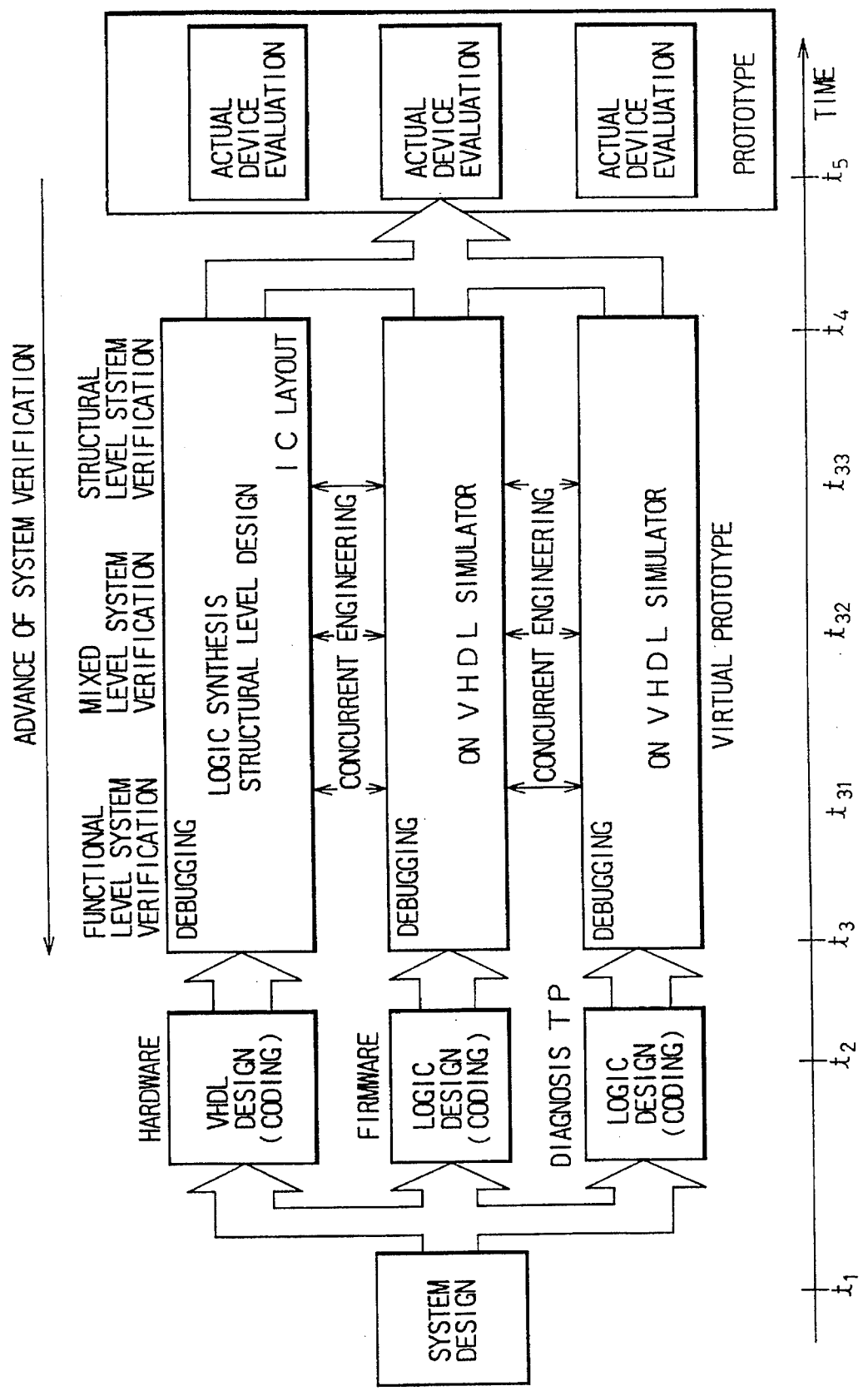
FIG. 7 is another explanatory view of the second embodiment of a digital circuit design assist method according to the present invention.

FIG. 7 is an explanatory view of the second embodiment of a digital circuit design assist method according to the present invention. This diagram represents the process in which the hardware and the software are simultaneously verified according to the present invention. The abscissa in the diagram represents a time axis, and the present invention is different from the prior art technology in that debugging can be done from t3 to t4. In other words, the diagram indicates that the hardware and the software constituting the digital circuit can be simultaneously verified before the actual device evaluation. In the time zone from t3 to t4, symbol t31 represents a verification time zone of the stage of the functional level, t32 represents the verification time zone of the mixed stage and t33 represents the verification time zone of the structural level.

Figure 8:
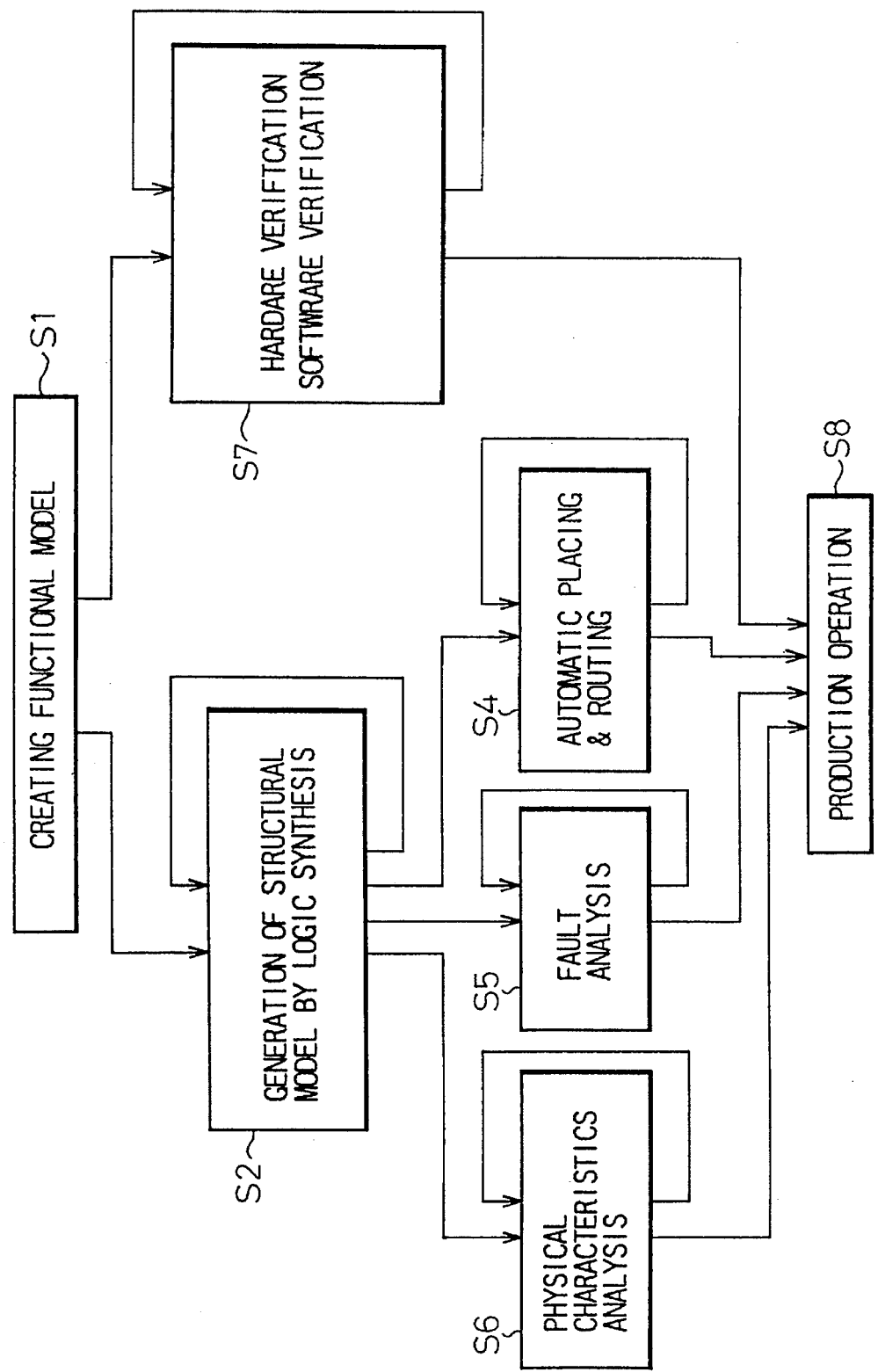
FIG. 8 is still another explanatory view showing a third embodiment of a digital circuit design assist method according to the present invention.

FIG. 8 is an explanatory view of the third embodiment of a digital circuit design assist method according to the present invention. This diagram indicates that the actual mounting operation and the verification operation can be simultaneously carried out. First, the functional model is produced (Step S1), the functional model is logically synthesized and converted to the structural model, or is produced through the text editor 15 by the coding input from the coding generation means, or by the block editor (schematic capture) 16 for expressing each of a plurality of components constituting the hardware by an inherent symbol, drawing and disposing these symbols on the screen and drawing and arranging wiring between these components on the screen so as to execute display processing (Step S2). Layout to be accomplished on the printed board or the LSI is automatically carried out by the automatic placing and routing tool 12 that places the components and routes the wirings on the basis of the dimensions of the components on the printed board or inside the LSI and of the amount of wiring (Step S4), and any fault of the structural model is analysed by the fault analysis tool 13 having an automatic test pattern generation tool for automatically generating a test pattern for analysing the fault of the structural model (Step S5), and whether or not the layout accomplishing the structural model on the printed board or in the integrated circuit is appropriate and whether or not evaluation of the digital circuit when mounted actually and physically is reliable, are verified by the physical characteristics analysis tool 14 on the basis of physical characteristics such as wiring lines, delay times, exothermy, etc, of the structural model, and/or radio waves (Step S6). On the other hand, logic certification of the functional model is carried out independently (Step S7). In the interim, the Steps S2, S4, S5 and S6 are repeatedly attempted, and a method of obtaining the best result is practiced at each of these steps. After the Step S7 is completed and moreover, after the Steps S4, S5 and S6 are completed, the production operation is commenced (Step S8).

Figure 1:
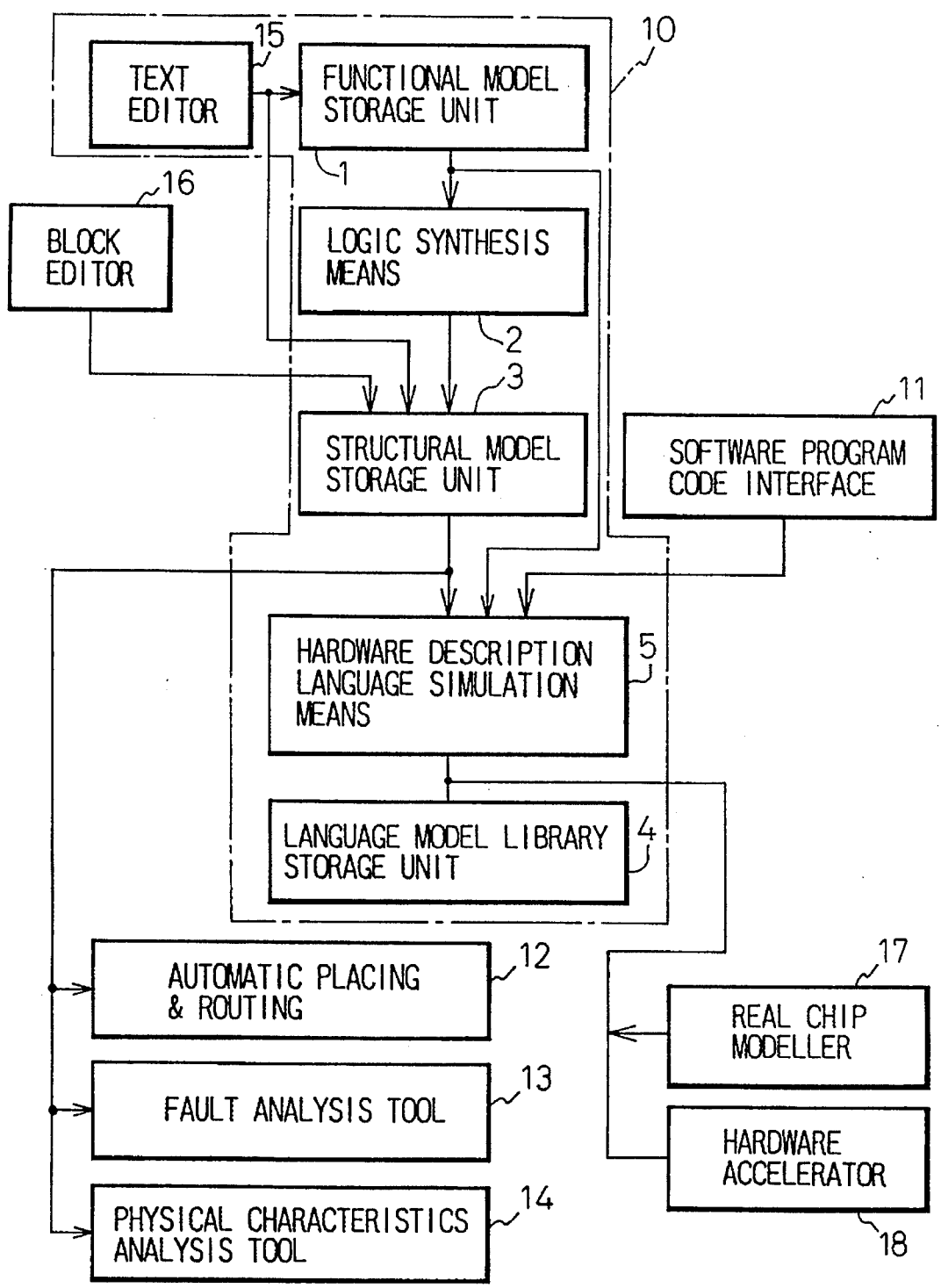
FIG. 1 is an overall structural view of a digital circuit design assist system according to the present invention.

Turning back again to FIG. 1, a real chip modeller 17 and a hardware accelerator 18 will be explained. The real chip modeller 17 is a system constituted by hardware, and can verify the logic of components such as LSIs of other manufacturers without generating them through the hardware description language. The hardware accelerator 18, too, is a system constituted by the hardware, and can simulate a part, or the entirety, of a digital circuit by exclusive hardware when the hardware becomes large and the quantity of computation becomes too long.

Figure 9:
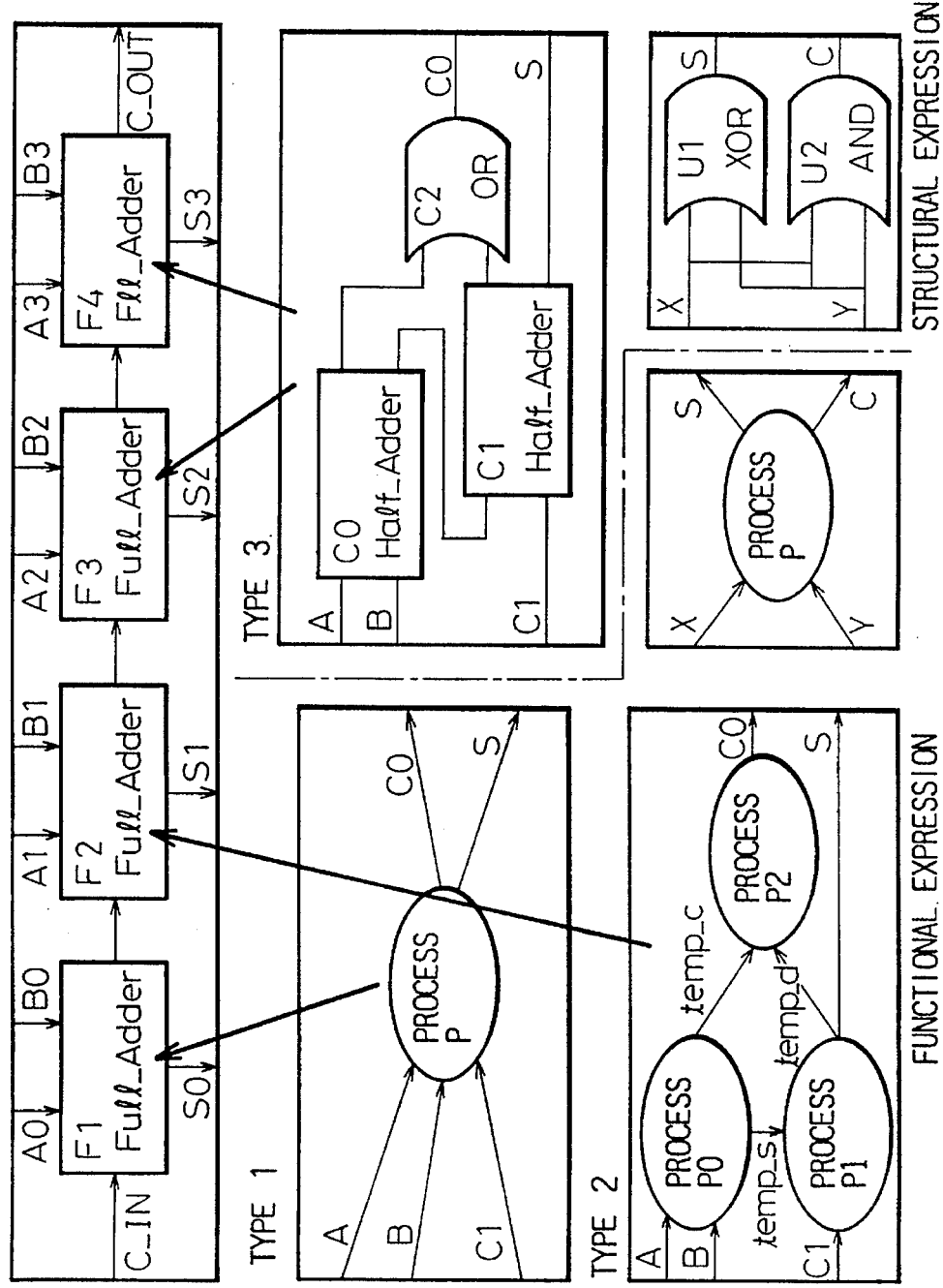
FIG. 9 is a block diagram showing a definite example of one digital circuit expressed by functional models and structural models.

FIG. 9 shows a definite example when one digital circuit is expressed by the functional model and the structural model. The upper part of the drawing shows four full adders F1, F2, F3 and F4 as a block diagram of one digital circuit. The full adder F1 is a functional model of a type I which 18 functionally expressed by VHDL and the full adder F2 is a functional model of a type 2 functionally expressed by the VHDL. The full adders F3 and F4 are structural models of a type 3 structurally expressed by VHDL. One of the half adders in the structural model expression of the type 3 is expressed by other functional model expression at the center of a lower stage, and the other half adder is expressed by other functional model expression on the right side of the lower stage.

FIG. 10 shows a program when the functional model shown in FIG. 9 is expressed by VHDL. In the diagram, the use of the full adder is first declared, and the architectures of the functional models for the full adders of the types 1 and 2 are shown next.

FIG. 11 shows a program when the structural model shown in FIG. 9 is expressed by VHDL. First, the use of full adders is declared, and the architecture of the full adder of the type 3 is shown next. Declaration of the use of full adders of this diagram is not necessary when the diagram continues from FIG. 10.

As described above, the digital circuit design assist system and the method thereof according to the present invention divide the hardware into a plurality of units, generate each functional model constituting the divided hardware, generates the structural model corresponding to each functional model by conversion through the logic synthesis means or by direct coding or by image processing, and can thus execute simultaneously and independently the verification of the logic of the hardware as one digital circuit for each divided hardware at the mixed level at which the functional model and the structural model exist in a mixture, before the actual device is fabricated. Accordingly, the present invention can reduce the design time necessary for the logic verification of the hardware of a particularly large-scale and high-quality digital circuit.

The digital circuit design assist system and the method thereof according to the present invention load the software to the memory in the hardware of the virtual digital circuit and independently verify the hardware and the software of the digital circuit having a unitary structure of hardware and software before the actual device is fabricated. Accordingly, the present invention can reduce the time necessary for this verification, and can improve the reliability of the actual device.

Furthermore, the digital circuit design assist system and the method thereof according to the present invention generate the structural model simultaneously with the verification of the functional model after all the functional models are generated, input the resulting structural model to the automatic placing and routing tool, the fault analysis tool or the physical characteristics analysis tool and executes the actual mounting design at an early stage, before the actual device is fabricated. Accordingly, when any problem of actual mounting is found by these tools, the verification of the functional model described above is suspended and re-design can be started. In consequence, any waste of design effort can be prevented in advance.

Since the digital circuit design assist system and the method thereof according to the present invention generate the hardware of the digital circuit by the use of the hardware description language, design can be made without considering the delay time and the dimensions of the components constituting the hardware, but simply considering the logic of the hardware. Accordingly, the design can be produced more easily.

According to the digital circuit design assist system and the method thereof according to the present invention, the hardware and the software can be verified independently before actual mounting but not after actual mount of the hardware. Therefore, the number of defective prototype devices can be reduced.

We claim:

1. A digital circuit design assist system for designing a desired digital circuit consisting of a plurality of hardware units and at least one firmware unit for controlling said digital circuit as a unit, said system comprising:

a functional model storage unit for storing each functional model functionally expressing each of said hardware units by a hardware description language through a text editor by coding input;

a logic synthesis means for converting said functional model into a structural model structurally expressed by said hardware description language;

a structural model storage unit for storing said structural model;

a language model library storage unit for storing a language model expressing each of a plurality of components constituting each of said hardware units by said hardware description language; and a hardware description language simulation means for verifying whether or not the logic of each said hardware unit is correct with regard to said functional model, said structural model and said language model, via a test model which supplies a test pattern to each of said functional models and each of said structural models, and receives outputs from the models to verify the behaviors of the models.

2. A digital circuit design assist system according to claim 1, further comprising:

a software program code interface for loading software, comprising said at least one firmware unit, an application program loaded to a storage unit of said digital circuit for executing a predetermined processes, and a diagnosis program for at least partially verifying the logic of said digital circuit, to said hardware description language simulation means, wherein said hardware description language simulation means further verifies whether software in a software unit in said digital circuit operates hardware units in said digital circuit as desired or not, and wherein memory such as RAM or ROM described in HDL is assigned in the digital circuit, software created as desired and stored in a storage in the digital circuit assist system by an assembler or a compiler is loaded to the memory by read/write statements of the hardware description language, a CPU provided in the digital circuit fetches the software for execution, and the software is verified by checking data written in the memory as a result of the execution of the software.

3. A digital circuit design assist system comprising a plurality of digital circuit design assist systems according to claim 2, wherein said hardware description language simulation means in each of said digital circuit design assist systems independently verifies each of said hardware units and each of said software units of said digital circuit from said functional model, said structural model, said language model and said software.

4. A digital circuit design assist system according to claim 3, further comprising:

an automatic placing and routing tool for automatically carrying out layout for arranging said structural model in a physical space in said digital circuit, for example, on a printed board or on an integrated circuit, on the basis of the dimensions of components expressed by said structural model and the amount of wiring, when said structural models are input thereto.

5. A digital circuit design assist system according to claim 3, further comprising a fault analysis tool for analyzing a fault of said structural model.

6. A digital circuit design assist system according to claim 5, wherein said fault analysis tool includes an automatic test pattern generation tool for automatically generating a test pattern for analyzing a fault of said structural model.

7. A digital circuit design assist system according to claim 3, further comprising:

a physical characteristics analysis tool for verifying whether or not said layout for arranging said structural models in a physical space in said digital circuit, for example, on a printed board or in an integrated circuit is appropriate, on the basis of physical characteristics such as wiring lines, delay times, exothermy, etc., of said structural model and/or radio waves, when said structural models are input thereto, and for evaluating the reliability of said digital circuit as an actual device when said layout is physically and actually realized.

8. A digital circuit design assist system according to claim 3, which further comprises at least one:

a coding generation means for generating said structural model through a text editor by coding input; and a graphic generation means for generating said structural model through a block editor for expressing each of a plurality of components constituting each said hardware unit by an inherent symbol, drawing and arranging said symbols on a screen, drawing wiring between said arranged components, and processing therefor.

9. A digital circuit design assist system according to claim 8, wherein said hardware description language simulation means verifies the logic of said digital circuit comprising only said functional models, said functional models and said structural models or only said structural models, as one digital circuit.

10. A digital circuit design assist system according to any of claims 1 through 9, wherein said hardware description language is a VHDL.

11. A digital circuit design assist method using a plurality of digital circuit design assist systems for designing a desired digital circuit consisting of a plurality of hardware units and at least one firmware unit for controlling said digital circuit as a unit, said method comprising:

a first step of generating each of functional models from each of a plurality of previously divided circuit units;

a second step of verifying the logic of said hardware units in said digital circuit as a complete device by hardware description language simulation means from functional models and from language models individually expressing a plurality of components constituting each of said hardware units by a hardware description language, (i) at a functional level stage where only said functional models functionally express said digital circuit in said hardware description language;

a third step of generating each of structural models having the same logic as that of the corresponding functional models by using any one of logic synthesis means for converting said functional models to said structural models structurally expressed by said hardware description language, coding generation means for generating new structural models through a text editor by coding input, and graphic generation means for generating new structural models through a block editor for expressing each of said components by an inherent symbol, drawing and arranging said symbols on a screen, drawing wires between said components arranged and image-processing them;

a fourth step of executing verification of the logic of each of said divided hardware units in said digital circuit as a complete device by said hardware description language simulation means from said functional models, said structural models and language models, (ii) at the stage of a mixed level at which said digital circuit is expressed as a mixed state of said functional models and said structural models; and a fifth step of verifying the logic of said hardware units in said digital circuit as a complete device by said hardware description language simulation means from said structural models and said language models, (iii) at the stage of the structural level at which said digital circuit is expressed by only said structural models.

12. A digital circuit design assist method using a plurality of digital circuit design assist systems for designing a desired digital circuit consisting of a plurality of hardware units and at least one firmware units for controlling said digital circuit as a unit, said method comprising:

a first step of down-loading software comprising at least one of said firmware, an application program loaded in a storage unit of said digital circuit, for executing a predetermined processing, and a diagnostic program for verifying the logic at least a part of said digital circuit, to said hardware description language simulation means through a software program code interface;

a second step of verifying the logic of said hardware units in said digital circuit as one complete digital circuit by said hardware description language simulation means from said functional models, a language models expressing individually a plurality of components constituting each of said hardware units by said hardware description language and said software, and verifying the logic of said software independently from the verification of the logic of said hardware units, (i) at the stage of the functional level at which said digital circuit is expressed by only said functional models functionally expressing each of said divided digital circuits by said hardware description language;

a third step of generating said structural models by the use of at least one logic synthesis means for converting said functional models to said structural models structurally expressed by said hardware description language, coding generation means for generating new structural models through a text editor by coding input and graphic generation means for generating new structural models through a block editor for expressing each of said components by an inherent symbol, drawing and arranging said symbols on a screen, drawing wiring between said components and image-processing them;

a fourth step of verifying the logic of said hardware units in said digital circuit as one complete digital circuit by said hardware description language simulation means from said functional models, said structural models, said language models and said software, and verifying the logic of said software independently from the verification of the logic of said hardware unit, (ii) at the stage of a mixed level where said digital circuit is expressed by said functional models and said structural models in a mixed state; and a fifth step of verifying the logic of said hardware units in said circuit as one complete digital circuit by said hardware description language simulation means from said structural models, said language models and said software, and verifying the logic from said software independently from the verification of the logic of said hardware units, (iii) at the stage of a structural level where said digital circuit is expressed by only said structural models.

13. A digital circuit design assist method using a plurality of digital circuit design assist systems for designing a desired digital circuit consisting of a plurality of hardware units and at least one firmware unit for controlling said digital circuit as a unit, said method comprising:

a first step of creating a functional model functionally expressing a plurality of said divided digital circuits by a hardware description language;

a second step of verifying the logic of said functional models by hardware description language simulation means and simultaneously executing substitution of said functional models to corresponding structural models without waiting for the verification of said logic, until creation of said functional models are completed; and a third step of independently executing automatic generation of layout for arranging said structural models in a physical space in said digital circuit, for example, on a printed board or on an integrated circuit by an automatic placing and routing tool on the basis of the dimensions of components expressed by said structural model and the amount of wiring, and verification of the logic of said hardware units.

14. A digital circuit design assist method according to claim 13, wherein said third step independently executes automatic generation of a test pattern for fault analysis of said structural models, analysis of any fault of said structural models and verification of the logic of said hardware units by an automatic test pattern tool and a fault analysis tool; on the basis of said digital circuit for which verification of said logic is under way or is completed, and wherein all of said functional models have already been converted to said structural models.

15. A digital circuit design assist method according to claim 13, wherein verification whether or not said layout arranging said structural models in a physical space in said digital circuit, for example, on a printed board or on an integrated circuit is appropriate, verification of reliability evaluation of an actual device of said digital circuit when mounted physically and actually, and verification of the logic of said hardware units, are executed independently by a physical characteristics analysis tool on the basis of physical characteristics such as the wiring lines, delay times, exothermy, etc., in said structural model and/or radio waves.

16. A digital circuit design assist system for designing a desired digital circuit consisting of a plurality of hardware units for controlling said digital circuit as a unit, said system comprising:

a functional model storage unit for storing each functional model functionally expressing each of said hardware units by a hardware description language through a text editor by coding input;

a logic synthesis means for converting said functional model into a structural model structurally expressed by said hardware description language;

a structural model storage unit for storing said structural model;

a language model library storage unit for storing a language model expressing each of a plurality of components constituting each of said hardware units by said hardware description language; and a hardware description language simulation means for verifying whether or not the logic of each said hardware unit is correct with regard to said functional model, said structural model and said language model, via a test model which supplies a test pattern to each of said functional models and each of said structural models and receives outputs from the models to verify the behaviors of the models.

17. A digital circuit design assist method using a plurality of digital circuit design assist systems for designing a desired digital circuit consisting of a plurality of hardware units for controlling said digital circuit as a unit, said method comprising:

a first step of generating each of functional models from each of a plurality of previously divided circuit units;

a second step of verifying the logic of said hardware units in said digital circuit as a complete device by hardware description language simulation means from functional models and from language models individually expressing a plurality of components constituting each of said hardware units by a hardware description language, (i) at a functional level stage where only said functional models functionally express said digital circuit in said hardware description language;

a third step of generating each of structural models having the same logic as that of the corresponding functional models by using any one of logic synthesis means for converting said functional models to said structural models structurally expressed by said hardware description language, coding generation means for generating new structural models through a text editor by coding input, and graphic generation means for generating new structural models through a block editor for expressing each of said components by an inherent symbol, drawing and arranging said symbols on a screen, drawing wires between said components arranged and image-processing them;

a fourth step of executing verification of the logic of each of said divided hardware units in said digital circuit as a complete device by said hardware description language simulation means from said functional models, said structural models and language models, (ii) at the stage of a mixed level at which said digital circuit is expressed as a mixed state of said functional models and said structural models; and a fifth step of verifying the logic of said hardware units in said digital circuit as a complete device by said hardware description language simulation means from said structural models and said language models, (iii) at the stage of the structural level at which said digital circuit is expressed by only said structural models.

18. A digital circuit design assist method using a plurality of digital circuit design assist systems for designing a desired digital circuit consisting of a plurality of hardware units for controlling said digital circuit as a unit, said method comprising:

a first step of down-loading software comprising at least one of said firmware, an application program loaded in a storage unit of said digital circuit, for executing a predetermined processing, and a diagnostic program for verifying the logic at least a part of said digital circuit, to said hardware description language simulation means through a software program code interface;

a second step of verifying the logic of said hardware units in said digital circuit as one complete digital circuit by said hardware description language simulation means from said functional models, a language models expressing individually a plurality of components constituting each of said hardware units by said hardware description language and said software, and verifying the logic of said software independently from the verification of the logic of said hardware units, (i) at the stage of the functional level at which said digital circuit is expressed by only said functional models functionally expressing each of said divided digital circuits by said hardware description language;

a third step of generating said structural models by the use of at least one logic synthesis means for converting said functional models to said structural models structurally expressed by said hardware description language, coding generation means for generating new structural models through a text editor by coding input and graphic generation means for generating new structural models through a block editor for expressing each of said components by an inherent symbol, drawing and arranging said symbols on a screen, drawing wiring between said components and image-processing them;

a fourth step of verifying the logic of said hardware units in said digital circuit as one complete digital circuit by said hardware description language simulation means from said functional models, said structural models, said language models and said software, and verifying the logic of said software independently from the verification of the logic of said hardware unit, (ii) at the stage of a mixed level where said digital circuit is expressed by said functional models and said structural models in a mixed state; and a fifth step of verifying the logic of said hardware units in said circuit as one complete digital circuit by said hardware description language simulation means from said structural models, said language models and said software, and verifying the logic from said software independently from the verification of the logic of said hardware units, (iii) at the stage of a structural level where said digital circuit is expressed by only said structural models.

19. A digital circuit design assist method using a plurality of digital circuit design assist systems for designing a desired digital circuit consisting of a plurality of hardware units for controlling said digital circuit as a unit, said method comprising:

a first step of creating a functional model functionally expressing a plurality of said divided digital circuits by a hardware description language;

a second step of verifying the logic of said functional models by hardware description language simulation means and simultaneously executing substitution of said functional models to corresponding structural models without waiting for the verification of said logic, until creation of said functional models are completed; and a third step of independently executing automatic generation of layout for arranging said structural models in a physical space in said digital circuit, for example, on a printed board or on an integrated circuit by an automatic placing and routing tool on the basis of the dimensions of components expressed by said structural model and the amount of wiring, and verification of the logic of said hardware units.

* * * * *